(12) United States Patent
Fukagawa et al.

(10) Patent No.: US 6,322,911 B1
(45) Date of Patent: Nov. 27, 2001

(54) SPIN-VALVE MAGNETIC RESISTANCE SENSOR AND THIN-FILM MAGNETIC HEAD

(75) Inventors: Tomoki Fukagawa, Amagasaki; Hiroshi Nishida; Masanori Ueno, both of Mishima-gun; Masateru Nose, Takaoka; Hideyasu Nagai; Fuminori Higami, both of Mishima-gun, all of (JP)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/495,822

(22) Filed: Feb. 1, 2000

(30) Foreign Application Priority Data

Feb. 1, 1999 (JP) .................................................. 11-023739

(51) Int. Cl.[7] ........................................................ G11B 5/66
(52) U.S. Cl. ............... 428/692; 428/694 T; 428/694 TS; 428/694 TM; 428/900; 360/113; 324/252
(58) Field of Search .......................... 428/694 T, 694 TS, 428/694 TM, 900, 692; 360/113; 324/252

(56) References Cited

U.S. PATENT DOCUMENTS 5,958,576 * 9/1999 Takiguchi .............................. 428/332
6,159,593 * 12/2000 Iwasaki ................................. 428/332

* cited by examiner

Primary Examiner—Leszek Kiliman
(74) Attorney, Agent, or Firm—Blakely, Sokoloff, Taylor & Zafman LLP

(57) ABSTRACT

The present invention provides a spin-valve magnetic resistance sensor in which an underlayer, which has a second underlayer film with an fcc structure consisting of an alloy formed by combining one or more elements selected from a set consisting of elements of group VIIIa and group Ib of the periodic table, and one or more elements selected from a set consisting of elements of groups IIa, IVa, Va, VIa, IIb, Ib and IVb of the periodic table, such as NiFeCrTi or NiCrTi, etc., is formed on the substrate, and a magnetic resistance (MR) film which has an antiferromagnetic layer consisting of a $Pt_{1-x}Mn_x$ alloy or an $Ir_{1-x}Mn_x$ alloy is laminated on top of this underlayer. The composition ratio of the element with the smallest free energy of oxide formation among the elements contained in the alloy of the second underlayer film is in the range of 0.1 atomic % to 15 atomic %.

11 Claims, 8 Drawing Sheets

SPIN-VALVE MAGNETIC RESISTANCE SENSOR AND THIN-FILM MAGNETIC HEAD

BACKGROUND OF THE INVENTION

1. Field of the Invention

The present invention concerns a magnetic resistance type sensor used in a magnetic recording device, and more specifically concerns a magnetic sensor and thin-film magnetic head utilizing the spin-valve magnetic resistance effect.

2. Background Information

Recently, magnetic resistance (MR) sensors consisting of a spin-valve film with a sandwich structure in which a pair of magnetic layers with a non-magnetic layer sandwiched in between are laminated on the surface of a substrate have been developed in order to reduce the saturation magnetic field and increase the magnetic field sensitivity in magnetic heads used for playback. In a spin-valve film, the magnetization of one magnetic layer (the pinned magnetic layer) is fixed in the direction of height of the element by the exchange-coupling magnetic field with the antiferromagnetic layer adjacent to said pinned magnetic layer, while the magnetization of the other magnetic layer (the free magnetic layer) is generally converted into a single magnetic domain in the direction of the track width of the element by a hard bias process utilizing the magnetic field of a permanent magnet, so that this magnetization can rotate freely in accordance with the external magnetic field.

As the unidirectional isotropic magnetic field created by the antiferromagnetic layer becomes larger, the pin magnetic layer can be more favorably converted into a single magnetic domain. Furthermore, as the magnetization of this layer becomes more thoroughly fixed, the linearity of the magnetic response to external magnetic fields is more reliably maintained, so that the magnetic characteristics of the magnetic sensor are improved. Accordingly, various antiferromagnetic materials have been proposed in the past. FIG. 11 shows the correlation between the MR ratio and the strength in the (111) direction of an antiferromagnetic layer consisting of PtMn in a so-called bottom type spin-valve film in which the antiferromagnetic layer is disposed on the substrate side.

It is known that the characteristics of antiferromagnetic materials vary according to the underlying material. For example, in Japanese Patent Application Kokai No. 8-315326, a magnetic resistance effect head is disclosed in which a crystalline soft magnetic film which has a high resistance and improves the orientation is installed as the underlayer of the magnetic resistance effect film, so that characteristics such as the magnetic resistance variation rate, etc., can be improved. Furthermore, the magnetic resistance sensor described in Japanese Patent Application Kokai No. 8-213238 uses a Ta underlayer in order to obtain a uniform crystal orientation in the magnetic free layer. Moreover, according to Japanese Patent Application Kokai No. 9-16915, the crystallinity of the antiferromagnetic layer can be improved, and the magnetization of the pin layer can be sufficiently fixed so that a linear magnetic resistance variation is obtained, by using a two-layer film consisting of a Ta film and an NiFe alloy film as the underlayer in a spin-valve magnetic resistance type transducer.

Furthermore, by using an NiFeCr or NiCr underlayer on the surface of the substrate, the magnetic resistance sensor described in U.S. Pat. No. 5,731,936 improves the crystalline structure of the magnetic resistance effect film formed on top of this underlayer, and greatly improves the MR ratio. Moreover, in a paper by Ken'ichi Aoshima et al. titled "Investigation of PdPtMn spin-valve film underlayers" (Nippon Oyo Jiki Gakkai-shi [journal of the Japanese Society of Applied Magnetism], Vol. 22, p. 501–504 (1998)), it is reported that a bottom type spin-valve magnetic resistance sensor using an NiFeCr alloy instead of the conventional NiFe alloy as an underlayer between the substrate and a PdPtMn antiferromagnetic layer disposed on the substrate side shows a higher resistivity than the abovementioned NiFe alloy, and that the current shunt loss is reduced and the MR ratio is improved, and furthermore that the (111) orientation of the antiferromagnetic layer is strengthened, so that the exchange-coupling magnetic field $H_{ua}$ is increased.

The results of measurements performed by the present applicant regarding the actual relationship between the MR ratio and the strength of the (111) orientation of an underlayer consisting of NiFe in a bottom type spin-valve film in which a PtMn antiferromagnetic layer is disposed on the substrate side are shown in FIG. 12. Furthermore, FIG. 13 shows the relationship between the coercive force Hc of the free magnetic layer and the strength of the (111) orientation of the NiFe underlayer in the same spin-valve film.

However, as a result of the presence of Cr, NiFeCr alloys have the property of bonding with oxygen more readily than NiFe alloys. In actuality, therefore, oxygen couples with the NiFeCr in the film formation process, so that the (111) orientation of the underlayer itself deteriorates, and the (111) orientation of the antiferromagnetic layer formed on top of this underlayer is weakened. As a result, a high MR ratio is not always obtained in actuality; furthermore, there is a danger that the coercive force of the free magnetic layer will increase so that the soft magnetic characteristics drop.

Meanwhile, in a so-called top spin-valve structure in which the antiferromagnetic layer is disposed on the side away from the substrate, if the (111) orientation of the free magnetic layer is insufficient, the ferromagnetic interaction between the free magnetic layer and the pin magnetic layer increases so that the playback output drops, and magnetic instability results. Furthermore, since the (111) orientation of the respective film layers formed on top of the free magnetic layer is weak, an improvement in the MR ratio cannot be achieved. Accordingly, as in the case of the abovementioned bottom spin-valve structure, the (111) orientation cannot be sufficiently strengthened if an NiFeCr alloy is used as the underlayer of the free magnetic layer.

Furthermore, these problems also occur in so-called synthetic type spin-valve structures in which the pin magnetic layer is constructed from a pair of ferromagnetic films that are antiferromagnetically coupled with a non-magnetic film sandwiched in between, and the antiferromagnetic layer and the ferromagnetic film adjacent to this antiferromagnetic layer are exchange-coupled in the presence of the applied magnetic field.

SUMMARY OF THE INVENTION

A spin-valve magnetic resistance sensor is disclosed. In one embodiment, the spin-valve magnetic resistance sensor includes an underlayer laminated on a surface of a substrate. The underlayer includes a non-magnetic material and a non-magnetic conductive layer sandwiched between a pair of ferromagnetic layers. The underlayer also includes an antiferromagnetic layer including one of a $Pt_{1-x}Mn_x$ alloy or an $Ir_{1-x}Mn_x$ alloy. The antiferromagnetic layer is adjacent to one of the pair of ferromagnetic layers. The underlayer also includes an alloy layer with an fcc structure having an alloy formed by combining one or more elements selected from a set comprising elements of group VIIIa and group Ib of a periodic table, and one or more elements selected from a set comprising elements of groups IIa, IVa, Va, VIa, IIb, IIIb and IVb of the periodic table. A composition ratio of an element that has a smallest free energy of oxide formation of elements of the alloy layer is in a range of 0.1 atomic % to 15 atomic %.

Figure 1:
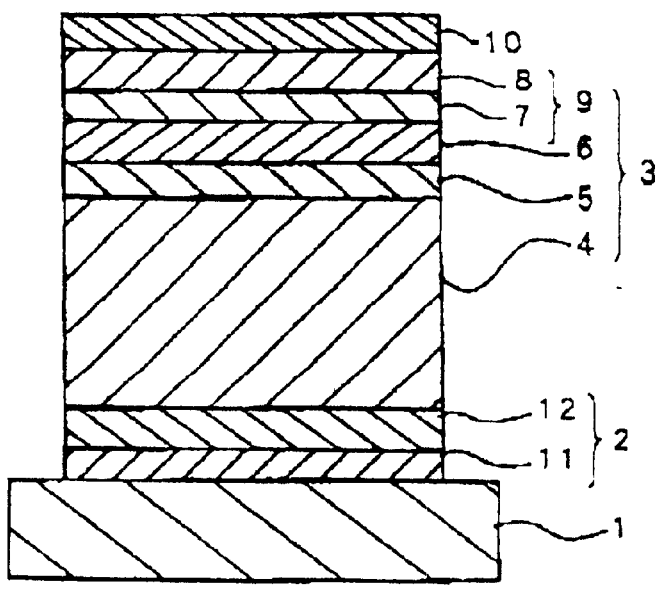
FIG. 1 is a model sectional view of the essential parts of a bottom spin-valve magnetic resistance sensor constituting a first working configuration of the present invention, as seen from the ABS side.

Explanations of the Symbols
1 Insulating layer
2 Underlayer
3 MR layer
4 Antiferromagnetic layer
5 Pin magnetic layer
6 Non-magnetic conductive layer
7 CoFefilm
8 Ni Fe film
9 Free magnetic layer
10 Protective layer
11 First under layer film
12 Second underlayer film
51 Ferromagnetic film
52 Non-magnetic film
53 Ferromagnetic film

DETAILED DESCRIPTION

The present invention was devised in light of the above-mentioned conventional problems. One aspect of the present invention improves the composition of the underlayer located between the substrate and the spin-valve film in a magnetic resistance sensor which has a spin-valve structure, thus strengthening the (111) orientation of the antiferromagnetic layer or ferromagnetic layer formed on top of this underlayer, so that the magnetic characteristics of the sensor are improved.

Furthermore, another aspect of the present invention provides a high-performance thin-film magnetic head which can achieve a higher recording density as a result of being equipped with such a spin-valve magnetic resistance sensor.

The present invention provides a spin-valve magnetic resistance sensor which is formed by laminating an underlayer consisting of a non-magnetic material, a pair of ferromagnetic layers between which a non-magnetic conductive layer is sandwiched, and an antiferromagnetic layer consisting of a $Pt_{1-x}Mn_x$ alloy or an $Ir_{1-x}Mn_x$ alloy which is adjacent to one of the ferromagnetic layers, on the surface of a substrate, this spin-valve magnetic resistance sensor being characterized by the fact that the underlayer has an alloy layer with an fcc structure consisting of an alloy formed by combining one or more elements selected from a set consisting of elements of group VIIIa and group Ib of the periodic table, and one or more elements selected from a set consisting of elements of groups IIa, IVa, Va, VIa, IIb, IIIb and IVb of the periodic table, and the composition ratio of the element that has the smallest free energy of oxide formation among the elements contained in this alloy layer is in the range of 0.1 atomic % to 15 atomic %.

The inventors of the present application discovered that an alloy with such a composition and crystalline structure tends not to bond with oxygen if the element which has the smallest free energy of oxide formation is included in the alloy at a content of 0.1 atomic % to 15 atomic %, so that the (111) orientation of the underlayer can be improved by forming the underlayer from an alloy layer with an fcc structure using such a composition. This discovery led to the perfection of the present invention. As a result, the (111) orientation of the antiferromagnetic layer or ferromagnetic layer formed on top of the underlayer is improved.

In a certain embodiment, if [a] the aforementioned alloy layer consists of an Ni—Cr—X alloy, [b] this X consists of one or more elements selected from a set consisting of elements of groups IIa, IVa, Va, VIa, IIb, IIIb and IVb of the periodic table, and [c] the composition ratio of X is in the range of 0.1 atomic % to 15 atomic %, this element X will bond with oxygen more readily than Cr, so that the good (111) orientation of NiCr prior to the addition of this element can be maintained. Accordingly, such a composition is desirable.

In another embodiment, if [a] the aforementioned alloy layer consists of an Ni—Fe—Cr—X alloy, [b] this X consists of one or more elements selected from a set consisting of elements of groups IIa, IVa, Va, VIa, IIb, IIIb and IVb of the periodic table, and [c] the composition ratio of X is in the range of 0.1 atomic % to 15 atomic %, this element X will similarly bond with oxygen more readily than Cr, so that the good (111) orientation of NiFeCr prior to the addition of this element can be maintained.

In particular, it is especially desirable to use one or more elements selected from a set consisting of Ti, Ta, V and Nb as such an element X.

Furthermore, the present invention provides a spin-valve magnetic resistance sensor which is formed by laminating an underlayer consisting of a non-magnetic material, a pair of ferromagnetic layers between which a non-magnetic conductive layer is sandwiched, and an antiferromagnetic layer consisting of a $Pt_{1-x}Mn_x$ alloy or an $Ir_{1-x}Mn_x$ alloy which is adjacent to one of the aforementioned ferromagnetic layers, on the surface of a substrate, this spin-valve magnetic resistance sensor being characterized by the fact that the aforementioned underlayer has an alloy layer with an fcc structure consisting of an alloy formed by combining only two or more elements selected from a set consisting of elements of group VIIIa and group Ib of the periodic table.

Examples of such alloys include NiCu and CuAg, etc. Since these alloys tend not to bond with oxygen, the (111) orientation of the underlayer itself can similarly be strengthened, and the (111) orientation of the antiferromagnetic layer or ferromagnetic layer formed on top of this underlayer can also be strengthened, by means of an underlayer which has an alloy layer with an fcc structure using such an alloy.

For example, the present invention can similarly be applied to a magnetic resistance sensor with either a bottom or top spin-valve structure in which the antiferromagnetic layer or the ferromagnetic layer that is not adjacent to the antiferromagnetic layer is formed on top of the aforementioned alloy layer of the underlayer. Furthermore, present invention can also be applied to a synthetic type spin-valve magnetic resistance sensor in which the ferromagnetic layer that is located adjacent to the antiferromagnetic layer consists of a pair of ferromagnetic films that are antiferromagnetically coupled with a non-magnetic film sandwiched in between, and the ferromagnetic film that is located adjacent to the antiferromagnetic layer is exchange-coupled with this antiferromagnetic layer in the presence of the applied magnetic field.

In a certain embodiment of the aforementioned synthetic spin-valve magnetic resistance sensor, the respective ferromagnetic films of the ferromagnetic layer that is located adjacent to the antiferromagnetic layer consist of a metal or alloy of two or more metals selected from a set consisting of Co, Fe and Ni, and the non-magnetic film consists of a metal or alloy of two or more metals selected from a set consisting of Ru, Cr, Rh and Ir.

In the case of a bottom or top spin-valve structure, the coercive force of the free magnetic layer can be reduced as a result of the strengthening of the (111) orientation of the antiferromagnetic layer. Meanwhile, in the case of a top spin-valve structure, the exchange-coupling magnetic field $H_{ua}$ is increased as a result of the improvement of the (111) orientation of the free magnetic layer; accordingly, the magnetization direction of the pin magnetic layer can be stabilized, and the interacting magnetic field $H_{int}$ can be reduced.

Furthermore, in another aspect of the present invention, a thin-film magnetic head equipped with the abovementioned spin-valve magnetic resistance sensor is provided; as a result, magnetically superior characteristics are obtained, and a high recording density is possible.

Below, preferred working configurations of the present invention will be described in detail with reference to the attached figures.

FIG. 1 is a sectional view of a magnetic resistance sensor with a bottom spin-valve structure constituting a first working configuration of the present invention, as seen from the ABS (air bearing surface) side. In this spin-valve magnetic resistance sensor, an underlayer 2 is formed on the surface of an alumina ($Al_2O_3$) insulating layer 1, which is installed on the surface of a substrate consisting of glass or a ceramic material such as silicon or $Al_2O_3TiC$, etc., and a magnetic resistance (MR) film 3 with a bottom spin-valve structure is laminated on the surface of this underlayer 2.

The MR film 3 has an antiferromagnetic layer 4 consisting of a PtMn film with a thickness of 300 angstroms that is laminated on the surface of the underlayer 2, a pin magnetic layer 5 consisting of a $Co_{90}Fe_{10}$ film with a thickness of 20 angstroms, a non-magnetic conductive layer 6 consisting of a Cu film with a thickness of 25 angstroms, and a free magnetic layer 9 consisting of a $Co_{90}Fe_{10}$ film 7 with a thickness of 10 angstroms and an $Ni_{80}Fe_{20}$ film 8 with a thickness of 50 angstroms. Following film formation, the MR film 3 is subjected to a specified heat treatment in a vacuum magnetic field so that the antiferromagnetic layer 4 is regularized; furthermore, a unidirectional isotropy is imparted to the pin magnetic layer 5 so that the direction of magnetization of this layer is fixed. A protective film 10 consisting of Ta with a thickness of 30 angstroms is formed on top of the MR film 3.

Both sides of the MR film 3 are removed by etching in accordance with a specified track width, and a hard bias layer and electric leads (not shown in the figures) used as electrodes for the flow of the sensing current, etc., are formed. Furthermore, this laminated structure as a whole is covered with an alumina insulating layer, thus completing the spin-valve MR sensor of the present invention.

The underlayer 2 has a two-layer structure formed by a first underlayer film 11 consisting of Ta with a thickness of 30 angstroms, and a second underlayer film 12 consisting of an alloy layer which has an fcc crystalline structure, and which consists of Ni—Fe—Cr—X with a thickness of 50 angstroms. This X consists of one or more elements selected from a set consisting of elements of groups IIa, IVa, Va, VIa, IIb, IIIb and IVb of the periodic table. The content of X, which has the smallest free energy of oxide formation among the elements contained in this alloy layer, is in the range of 0.1 atomic % to 15atomic %. If the content is less than the lower limit of this range, the proportion of X becomes smaller than the proportion of Cr, so that bonding with oxygen cannot be sufficiently inhibited. Conversely, if the content exceeds the upper limit of this range, the proportion of X exceeds the proportion of Cr, so that bonding with oxygen readily occurs. In either case, the (111) orientation of the second underlayer film 12 is weakened.

Figure 2:
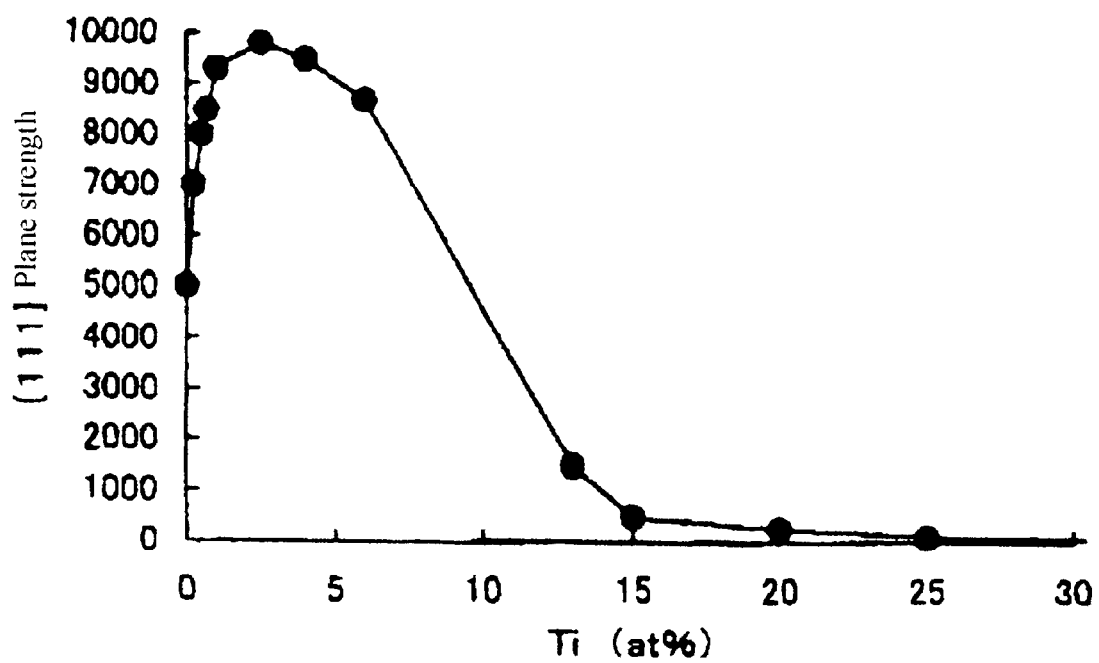
FIG. 2 is a graph which shows the relationship between the Ti content (at %) and the strength of the (111) orientation in a case where an alloy with a composition of $\{(Ni_{80}Fe_{20})_{75}Cr_{25}\}_{1-x}Ti_x$ is used as the underlayer.

In the magnetic resistance sensor with a bottom spin-valve structure shown in FIG. 1, Ti (belonging to group IVa of the periodic table) was selected as the aforementioned X, and the second underlayer film 12 of the underlayer 2 was formed by means of an alloy with an Ni—Fe—Cr—Ti composition. The strength of the (111) orientation of the aforementioned second underlayer film is plotted against the Ti content in FIG. 2. As is clear from the same figure, a strong (111) orientation was obtained at a Ti content of 0.1 atomic % to 15 3atomic %.

Figure 3:
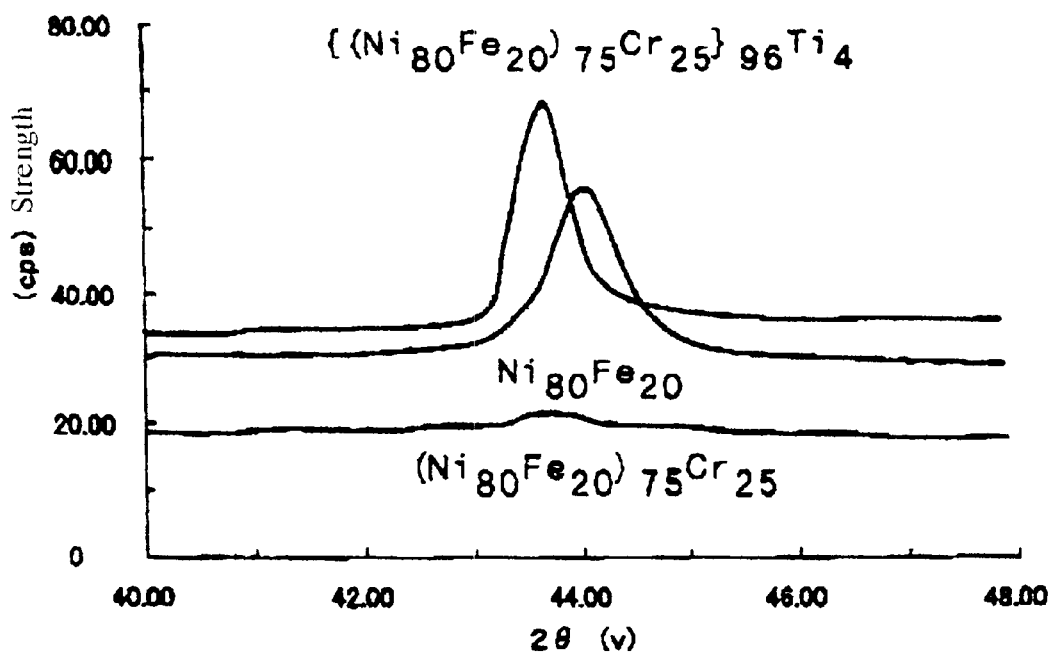
FIG. 3 compares the X-ray diffraction profile of an underlayer consisting of an alloy with a composition of $\{(Ni_{80}Fe_{20})_{75}Cr_{25}\}_{96}Ti_4$ with those of conventional alloys having compositions of $Ni_{80}Fe_{20}$ and $(Ni_{80}Fe_{20})_{75}Cr_{25}$.

Furthermore, the second underlayer film 12 of the underlayer 2 was formed by means of an alloy with a composition of $\{(Ni_{80}Fe_{20})_{75}Cr_{25}\}_{96}Ti_4$, in which the Ti content was 4 atomic %. As comparative examples, the second underlayer film 12 of the underlayer was formed using a conventional alloy with an $Ni_{80}Fe_{20}$ composition and an alloy with an $(Ni_{80}Fe_{20})_{75}Cr_{25}$ composition in spin-valve magnetic resistance sensors having the same structure as that shown in FIG. 1. Respective X-ray diffraction profiles measured for these second underlayer films are shown in FIG. 3. It is seen from this figure that the second underlayer film of the present invention shows an extremely high peak strength compared to the second underlayer films of both comparative examples in the vicinity of $2\theta=44°$.

Furthermore, the aforementioned second underlayer film of the present embodiment may also be formed by an alloy layer with an fcc structure which consists of an Ni—Cr—X alloy formed by adding one or more elements selected from a set consisting of elements of groups IIa, IVa, Va, VIa, IIb, IIIb and IVb of the periodic table as X to an Ni—Cr alloy, and in which the composition ratio of X is in the range of 0.1 atomic % to 15 atomic %. In this case as well, a second underlayer film with a strong (111) orientation can similarly be obtained.

Other elements of groups IIa, IVa, Va, VIa, IIb, IIIb and IVb of the periodic table besides Ti can be selected as X in the aforementioned Ni—Fe—Cr—X alloy and Ni—Cr—X alloy, and a similar effect may be expected as a result. Ta, V and Nb are especially desirable.

Furthermore, in the present invention, a second underlayer film with a strong (111) orientation can similarly be formed by means of an alloy layer with an fcc structure consisting of another alloy which consists of a combination of one or more elements selected from elements of group VIIIa and group Ib of the periodic table and one or more elements selected from elements of groups IIa, IVa, Va, VIa, IIb, IIIb and IVb of the periodic table, in which the composition ratio of the element with the smallest free energy of oxide formation among the elements contained in the alloy is in the range of 0.1 atomic % to 15 atomic %.

Furthermore, in the present invention, the aforementioned second underlayer film may also be formed by means of an alloy with an fcc structure which consists only of two or more elements selected from group VIIIa and group Ib of the periodic table, such as NiCu or CuAg, etc. Since these alloys have the property of not readily bonding with oxygen, the (111) orientation of the second underlayer film can similarly be strengthened.

Furthermore, in another embodiment, the antiferromagnetic layer 4 in the spin-valve magnetic resistance sensor shown in FIG. 1 can be formed using an IrMn alloy $(Ir_{1-x}Mn_x)$ instead of the abovementioned PtMn alloy $(Pt_{1-x}Mn_x)$. In the case of either of these antiferromagnetic layers, the (111) orientation is strengthened if the layer is formed on top of the underlayer of the present invention, so that the exchange-coupling magnetic field with the pin magnetic layer can be increased.

Figure 4:
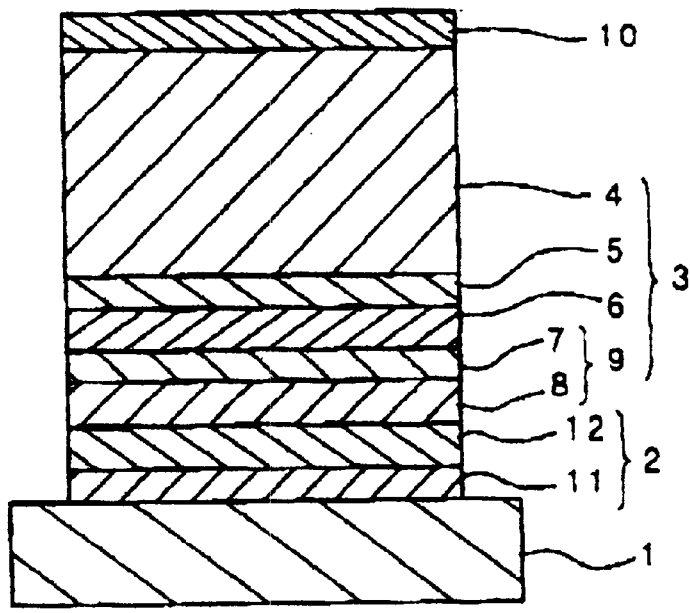
FIG. 4 is a model sectional view of the essential parts of a top spin-valve magnetic resistance sensor constituting a second working configuration of the present invention, as seen from the ABS side.

FIG. 4 is a sectional view of a magnetic resistance sensor with a top spin-valve structure constituting a second working configuration of the present invention. This embodiment has a structure similar to that of the embodiment shown in FIG. 1 in that an alumina insulating layer 1, an underlayer 2 consisting of a first underlayer film 11 of Ta and a second underlayer film 12 of an Ni—Fe—Cr—X alloy, an MR film 3 and a protective film 10 are laminated on the surface of a substrate. However, this embodiment differs from the embodiment shown in FIG. 1 in that the respective film layers of the MR film 3 are disposed in the opposite order from that of the embodiment shown in FIG. 1, i.e., the free magnetic layer 9 is disposed on the side of the substrate, and the antiferromagnetic layer 4 is disposed on the opposite side from the substrate.

In the present embodiment as well, the second underlayer film 12 is formed by an alloy layer similar to that of the embodiment shown in FIG. 1, so that the (111) orientation is strengthened. Accordingly, the (111) orientation of the spin-valve film as a whole is conspicuously increased. As a result, a high MR ratio is obtained, and the exchange-coupling magnetic field $H_{ex}$ is increased; furthermore, the interacting magnetic field $H_{int}$ is decreased so that the asymmetry of the playback output is greatly improved.

Figure 5:
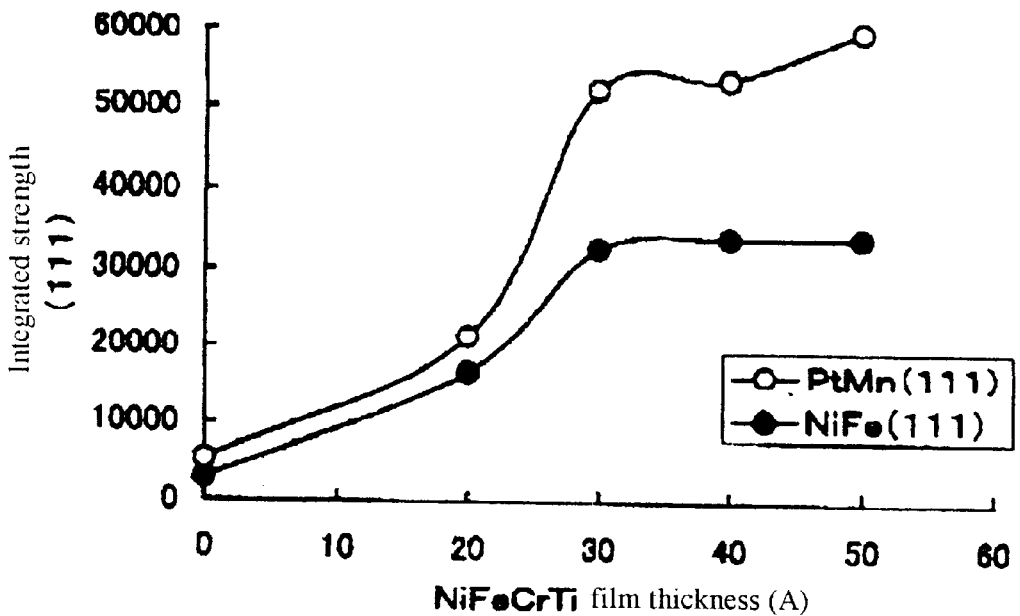
FIG. 5 is a diagram showing X-ray diffraction profiles which illustrate the relationship between the thickness of the underlayer consisting of an Ni—Fe—Cr—Ti alloy and the strength of the (111) orientation an antiferromagnetic layer consisting of a PtMn alloy and a free magnetic layer consisting of an NiFe alloy.

In the magnetic resistance sensor with a top spin-valve structure shown in FIG. 4, Ti belonging to group IVa of the periodic table was selected as the aforementioned X, and the second underlayer film 12 of the underlayer 2 was formed by an alloy with an Ni—Fe—Cr—Ti composition. FIG. 5 shows the respective strengths of the (111) orientations of the antiferromagnetic layer 4 consisting of a PtMn alloy, and the NiFe film 8 of the free magnetic layer 9, with respect to the thickness t of the second underlayer film 12 when the thickness of the first underlayer film 11 is fixed. It is seen from these X-ray diffraction profiles that the (111) orientation of both of the aforementioned film layers more or less increases with an increase in the thickness t of the second underlayer film, and that an especially strong (111) orientation is shown in the range of approximately $20 \leq t \leq 50$ angstroms.

Figure 6:
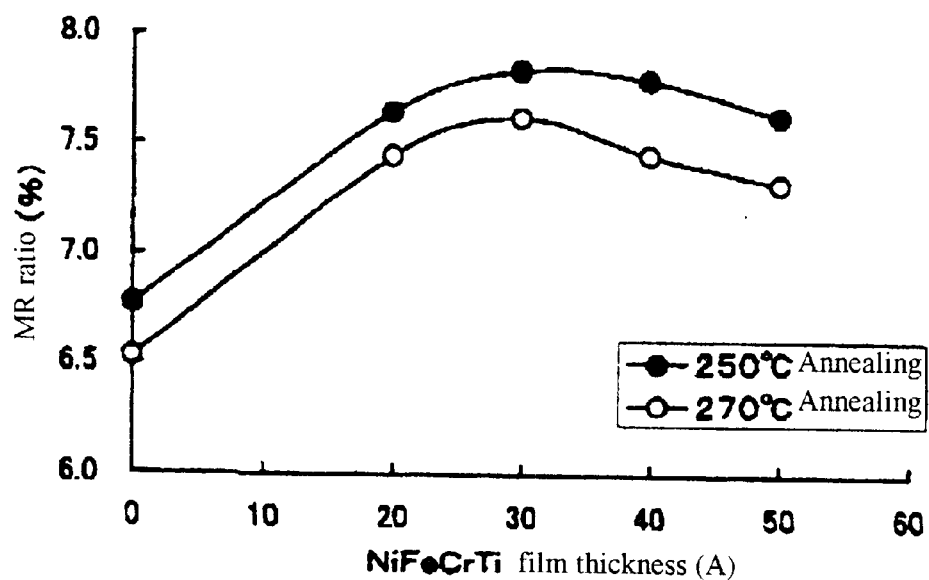
FIG. 6 is a diagram showing X-ray diffraction profiles which illustrate the relationship between the thickness of the underlayer consisting of an Ni—Fe—Cr—Ti alloy and the MR ratio.
Figure 7:
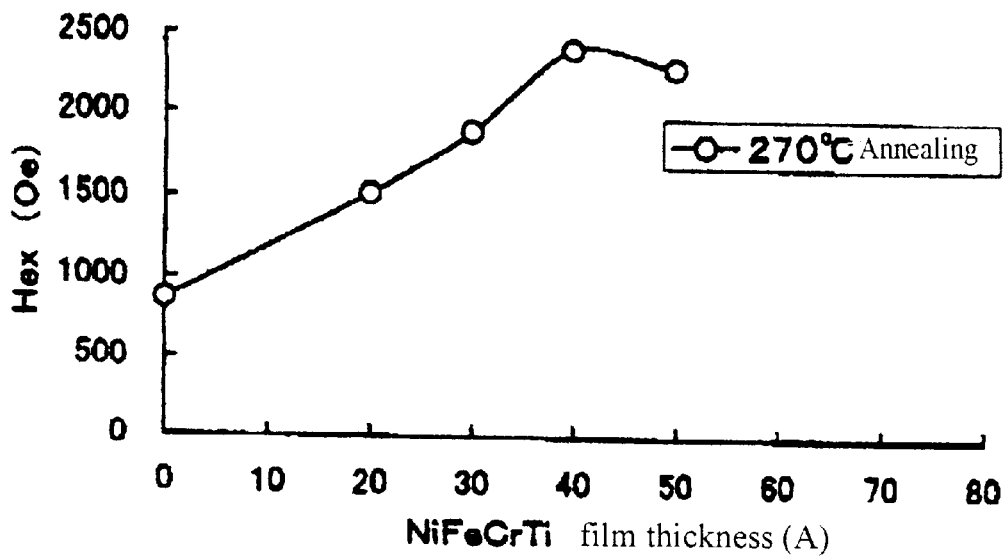
FIG. 7 is a diagram showing an X-ray diffraction profile which illustrates the relationship between the thickness of the underlayer consisting of an Ni—Fe—Cr—Ti alloy and the exchange-coupling magnetic field $H_{ex}$.

FIG. 6 shows the relationship between the thickness t of the second underlayer film 12 (with an Ni—Fe—Cr—Ti composition) and the MR ratio with the thickness of the first underlayer film 11 consisting of Ta fixed in the same top spin-valve structure in a case where the MR film 3 is heat-treated at 270° C. FIG. 6 shows two heat treatment temperatures, while FIG. 7 shows a single heat treatment temperature. It is seen from this X-ray diffraction profile that the MR ratio more or less increases with an increase in the thickness t of the second underlayer film, and that an especially high MR ratio is shown in the range of approximately $20 \leq t \leq 50$ angstroms.

Furthermore, FIG. 7 similarly shows the relationship between the thickness t of the second underlayer film 12 (with an Ni—Fe—Cr—Ti composition) and the exchange-coupling magnetic field $H_{ex}$ when the thickness of the first underlayer film 11 consisting of Ta is fixed in the same top spin-valve structure in respective cases where the MR film 3 is heat-treated at 250° C. and 270° C. It is seen from these X-ray diffraction profiles that the exchange-coupling magnetic field $H_{ex}$ more or less increases with an increase in the thickness t of the second underlayer film, and that an especially high exchange-coupling magnetic field is shown in the range of approximately $20 \leq t2 \leq 50$ angstroms.

Figure 8:
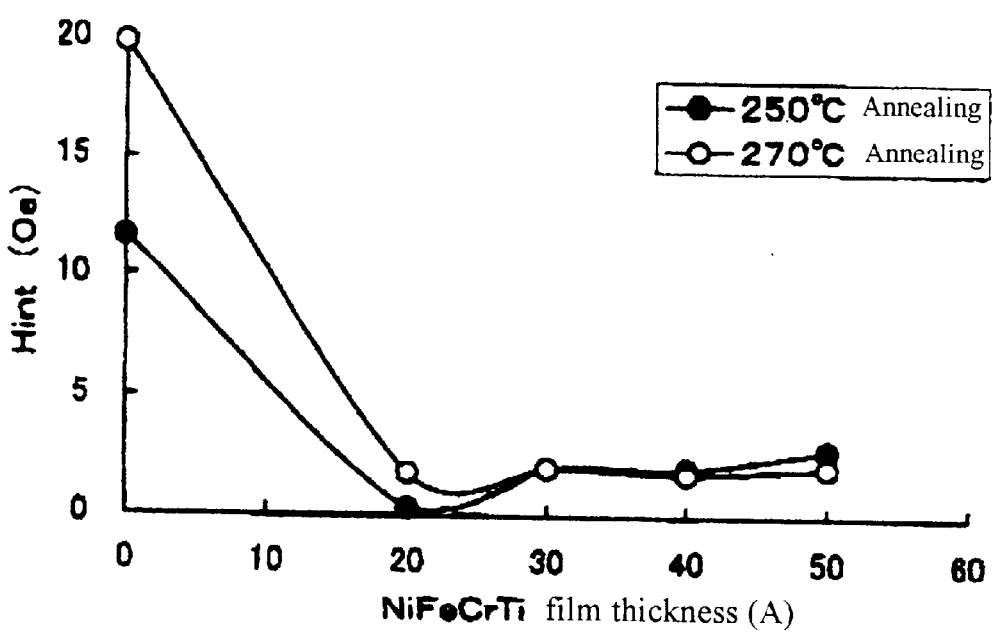
FIG. 8 is a diagram showing X-ray diffraction profiles which illustrate the relationship between the thickness of the underlayer consisting of an Ni-Fe-Cr-Ti alloy and the interacting magnetic field $H_{int}$.

Furthermore, FIG. 8 similarly shows the relationship between the thickness t of the second underlayer film 12 (with an Ni—Fe—Cr—Ti composition) and the interacting magnetic field $H_{int}$ between the pin magnetic layer 5 and free magnetic layer 9 when the thickness of the first underlayer film 11 consisting of Ta is fixed in the same top spin-valve structure in respective cases where the MR film 3 is heat-treated at 250° C. and 270° C. It is seen from these X-ray diffraction profiles that the interacting magnetic field $H_{int}$ more or less drops with a decrease in the thickness t of the second underlayer film, and that an especially low interacting magnetic field is shown in the range of approximately $20 \leq t \leq 50$ angstroms.

Figure 9:
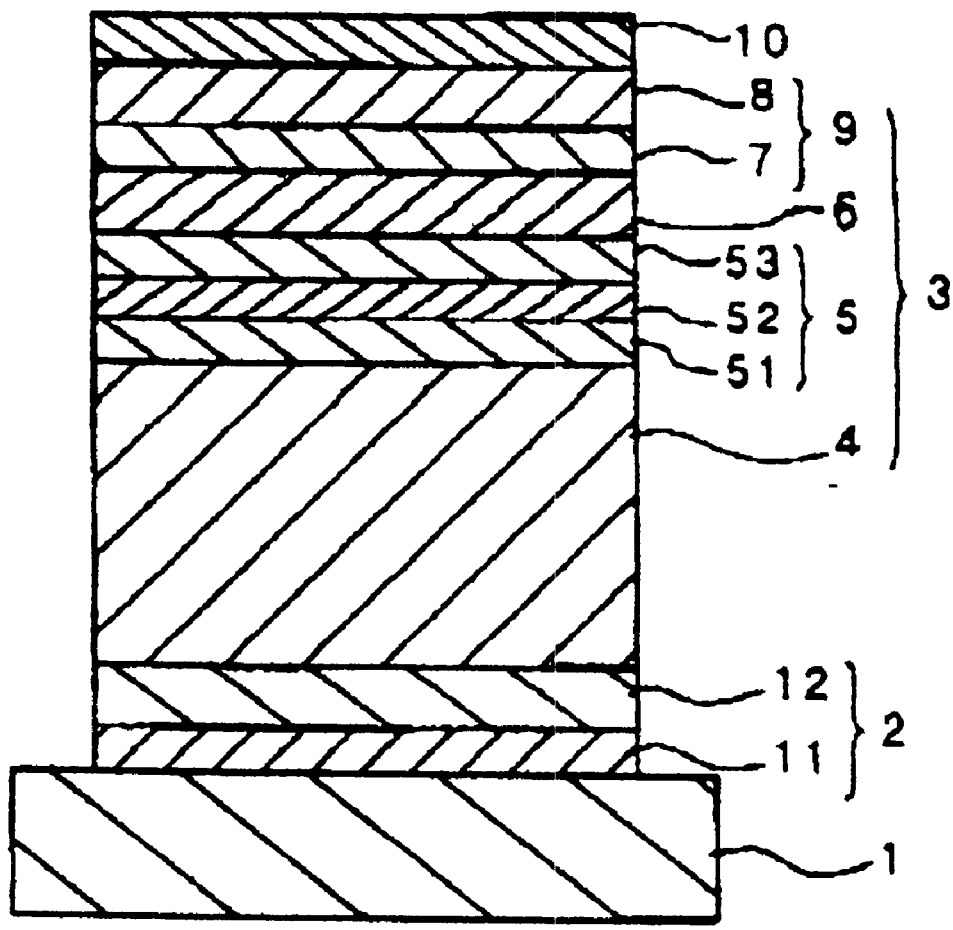
FIG. 9 is a model sectional view of the essential parts of a bottom synthetic spin-valve magnetic resistance sensor constituting a third working configuration of the present invention, as seen from the ABS side.

FIG. 9 is a sectional view which illustrates a magnetic resistance sensor with a bottom synthetic pin-valve structure constituting a third working configuration of the present invention. This embodiment has a structure similar to that of the embodiment shown in FIG. 1 in that an alumina insulating layer 1, an underlayer 2 consisting of a first underlayer film 11 of Ta and a second underlayer film 12 of an Ni—Fe—Cr—X alloy, an MR film 3 whose antiferromagnetic layer 4 is disposed on the substrate side, and a protective film 10, are formed on a substrate. However, this embodiment differs from the embodiment shown in FIG. 1 in that the pin magnetic layer 5 of the MR film 3 has a synthetic structure.

Specifically, the pin magnetic layer 5 is constructed from (for example) a ferromagnetic film 51 with a thickness of 20 angstroms consisting of $Co_{90}Fe_{10}$ and a ferromagnetic film 53 with a thickness of 23 angstroms consisting of $Co_{90}Fe_{10}$, which are antiferromagnetically coupled with a non-magnetic film 52 consisting of Ru and having a thickness of 8 angstroms sandwiched in between, and the system is arranged so that the ferromagnetic film 51 on the side adjacent to the antiferromagnetic layer 4 and said antiferromagnetic layer 4 are exchange-coupled in the presence of the applied magnetic field. Besides a CoFe alloy, the ferromagnetic film 51 that is exchange-coupled with the antiferromagnetic layer may be formed from (for example) a metal or other alloy consisting of two or more metals selected from a set consisting of Co, Fe and Ni. Furthermore, besides Ru, the non-magnetic film 52 may be formed from a metal selected from a set consisting of Cr, Rh and Ir, or an alloy consisting of two or more metals selected from a set consisting of these metals and Ru.

In the present embodiment as well, the second underlayer film 12 is formed by an alloy layer similar to that used in the abovementioned embodiments, so that the (111) orientation of this underlayer film is strengthened. Accordingly, the (111) orientation of the spin-valve film as a whole is conspicuously improved; as a result, the MR ratio is increased, the exchange-coupling magnetic field $H_{ua}$ is increased, and the coercive force of the free magnetic layer is lowered, so that the soft magnetic characteristics are greatly improved.

Figure 10:
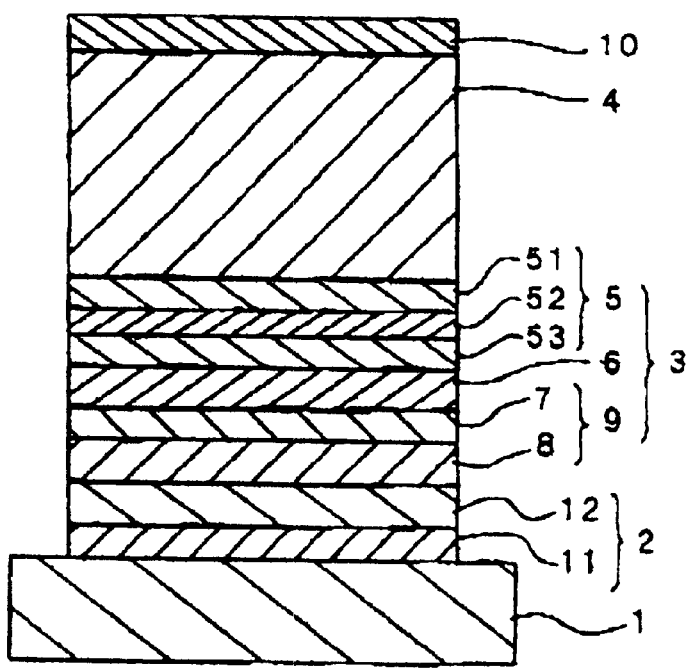
FIG. 10 is a model sectional view of the essential parts of a top synthetic spin-valve magnetic resistance sensor constituting a third working configuration of the present invention, as seen from the ABS side.
Figure 11:
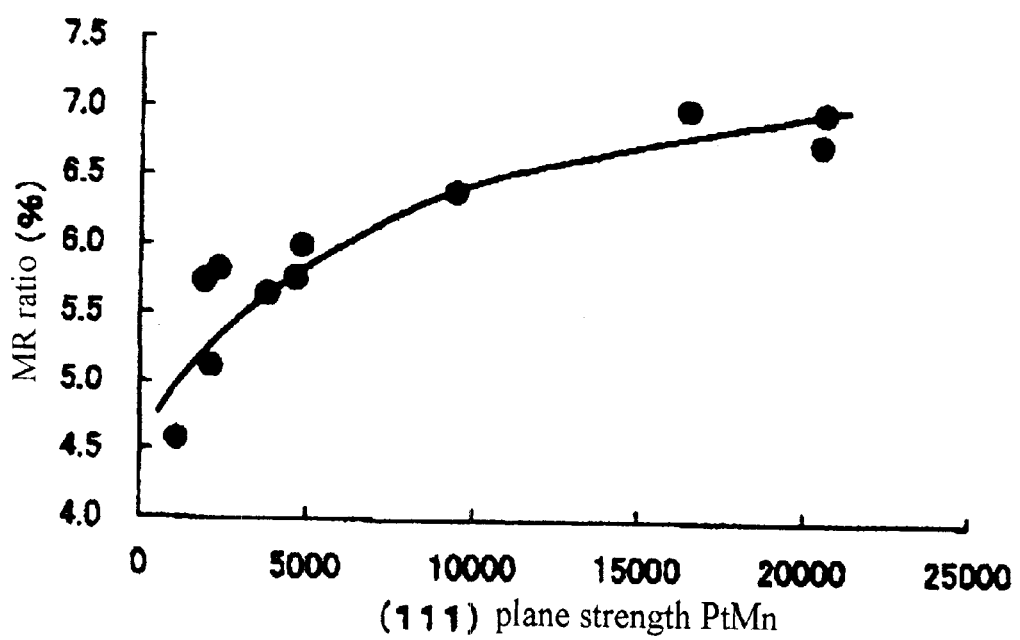
FIG. 11 is a graph showing the relationship between the strength of the (111) orientation of an antiferromagnetic layer consisting of a PtMn alloy and the MR ratio.
Figure 12:
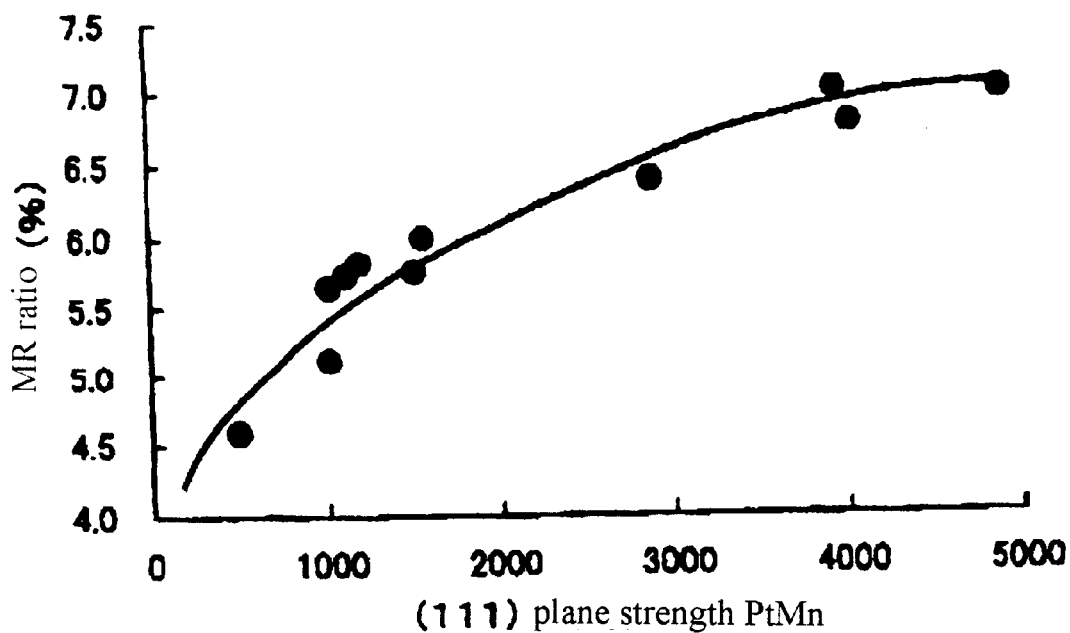
FIG. 12 is a graph showing the relationship between the strength of the (111) orientation of an underlayer consisting of an NiFe alloy and the MR ratio.
Figure 13:
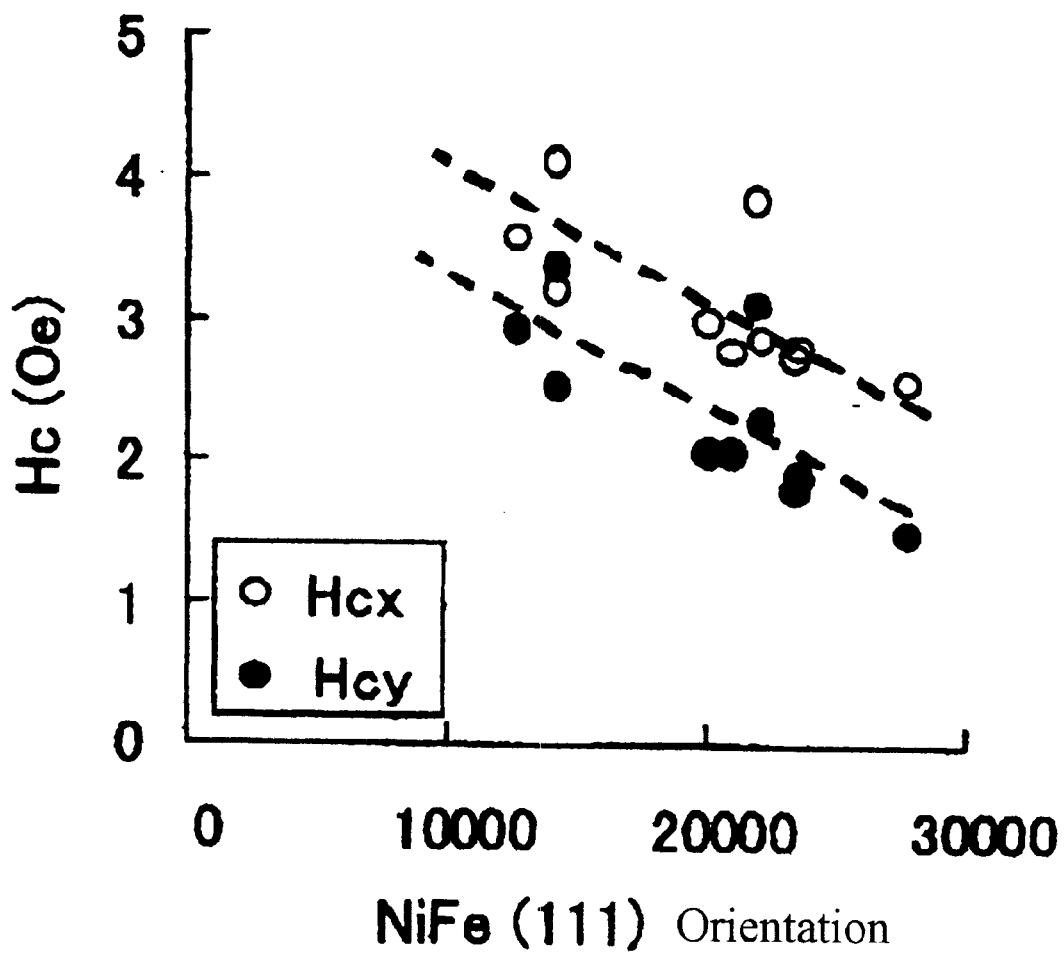
FIG. 13 is a graph showing the relationship between the strength of the (111) orientation of an underlayer consisting of an NiFe alloy and the coercive force Hc.

FIG. 10 is a sectional view which illustrates a magnetic resistance sensor with a top synthetic spin-valve structure constituting a fourth working configuration of the present invention. This embodiment has a structure similar to that of the embodiment shown in FIG. 4 in that an alumina insulating layer 1, an underlayer 2 consisting of a first underlayer film 11 of Ta and a second underlayer film 12 of an Ni—Fe—Cr—X alloy, an MR film 3 whose antiferromagnetic layer 4 is disposed on the opposite side from the substrate, and a protective film 10, are formed on a substrate. However, this embodiment differs from the embodiment shown in FIG. 4 in that the pin magnetic layer 5 of the MR film 3 has a synthetic structure.

Specifically, as in the embodiment shown in FIG. 9, the pin magnetic layer 5 is constructed from (for example) a ferromagnetic film 51 with a thickness of 20 angstroms consisting of $Co_{90}Fe_{10}$ and a ferromagnetic film 53 with a thickness of 23 angstroms consisting of $Co_{90}Fe_{10}$, which are antiferromagnetically coupled with a non-magnetic film 52 consisting of Ru and having a thickness of 8 angstroms sandwiched in between, and the system is arranged so that the ferromagnetic film 51 on the side adjacent to the antiferromagnetic layer 4 and said antiferromagnetic layer 4 are exchange-coupled in the presence of the applied magnetic field. Besides a CoFe alloy, the ferromagnetic film 51 that is exchange-coupled with the antiferromagnetic layer may be formed from (for example) a metal or other alloy consisting of two or more metals selected from a set consisting of Co, Fe and Ni. Furthermore, besides Ru, the non-magnetic film 52 may be formed from a metal selected from a set consisting of Cr, Rh and Ir, or an alloy consisting of two or more metals selected from a set consisting of these metals and Ru.

In the present embodiment as well, the second underlayer film 12 is formed by an alloy layer similar to that used in the abovementioned embodiments, so that the (111) orientation of this underlayer film is strengthened. Accordingly, the (111) orientation of the spin-valve film as a whole is conspicuously improved; as a result, the MR ratio is increased, the direction of magnetization of the pin magnetic layer is stably fixed, the interacting magnetic filed $H_{int}$ is reduced, and the asymmetry of the playback output is greatly improved.

In a spin-valve magnetic resistance sensor equipped with the underlayer of the present invention, as is clear from the above description, a high orientation can be stably obtained so that the (111) orientation of the spin-valve film as a whole can be strengthened. Accordingly, the MR ratio is improved. Especially in cases where the present invention is applied to a bottom spin-valve structure, the soft magnetic characteristics of the free magnetic layer are greatly improved. Furthermore, in the case of a synthetic type structure, the effect of the present invention in improving the soft magnetic characteristics of the free magnetic layer is even more conspicuous. Moreover, in cases where the present invention is applied to a top spin-valve structure, the exchange-coupling magnetic field $H_{ex}$ is increased, and the interacting magnetic field $H_{int}$ is lowered so that the asymmetry can be reduced. Furthermore, in the case of a synthetic type structure, the effect of the present invention in improving the MR ratio is even more conspicuous; in addition, the direction of magnetization of the pin magnetic layer can be stably fixed. Accordingly, in the spin-valve magnetic resistance sensor of the present invention, magnetically superior characteristics are obtained, and an improvement in magnetic transducing characteristics such as a high magnetic resistance variation rate and linearity of the magnetic resistance variation, etc., can be achieved. As a result, furthermore, a magnetic head capable of a high recording density can be realized.

What is claimed is:

1. A spin-valve magnetic resistance sensor, comprising:

an underlayer laminated on a surface of a substrate, the underlayer including:
   a non-magnetic material;
   a non-magnetic conductive layer sandwiched between a pair of ferromagnetic layers;
   an antiferromagnetic layer comprising one of a $Pt_{1-x}Mn_x$ alloy or an $Ir_{1-x}Mn_x$ alloy, wherein the antiferromagnetic layer is adjacent to one of the pair of ferromagnetic layers; and
   an alloy layer with an fcc structure having an alloy formed by combining one or more elements selected from a set comprising elements of group VIIIa and group Ib of a periodic table, and one or more elements selected from a set comprising elements of groups IIa, IVa, Va, VIa, IIb, IIIb and IVb of the periodic table, wherein a composition ratio of an element that has a smallest free energy of oxide formation of elements of the alloy layer is in a range of 0.1 atomic % to 15 atomic %.

2. The spin-valve magnetic resistance sensor of claim 1 wherein the alloy layer comprises an Ni—Cr—X alloy, wherein X comprises one or more elements selected from a set comprising elements of groups IIa, IVa, Va, VIa, IIb, IIIb and IVb of the periodic table, wherein a composition ratio of X is in the range of 0.1 atomic % to 15 atomic %.

3. The spin-valve magnetic resistance sensor of claim 1 wherein the alloy layer comprises an Ni—Fe—Cr—X alloy, wherein X comprises one or more elements selected from a set comprising elements of groups IIa, IVa, Va, VIa, IIb, IIIb and IVb of the periodic table, wherein a composition ratio of X is in the range of 0.1 atomic % to 15 atomic %.

4. The spin-valve magnetic resistance sensor of claim 2 wherein X comprises one or more elements selected from a set comprising Ti, Ta, V and Nb.

5. A spin-valve magnetic resistance sensor, comprising:
an underlayer laminated on a surface of a substrate, the underlayer including:
a non-magnetic material;
a non-magnetic conductive layer sandwiched between a pair of ferromagnetic layers;
an antiferromagnetic layer comprising one of a $Pt_{1-x}Mn_x$ alloy or an $Ir_{1-x}Mn_x$ alloy, wherein the antiferromagnetic layer is adjacent to one of the pair of ferromagnetic layers; and
an alloy layer having an fcc structure comprising an alloy formed by combining only two or more elements from a set comprising elements of group VIIIa and group Ib of a periodic table.

6. The spin-valve magnetic resistance sensor of claim 5 wherein the alloy layer comprises one of NiCu or CuAg.

7. The spin-valve magnetic resistance sensor of claim 1 wherein the antiferromagnetic layer is formed adjacent to a surface of the alloy layer of the underlayer.

8. The spin-valve magnetic resistance sensor of claim 1 wherein an other one of the pair of ferromagnetic layers is formed adjacent to a surface of the alloy layer of the underlayer, wherein the antiferromagnetic layer is formed adjacent to a surface of said one of the pair of ferromagnetic layers.

9. The spin-valve magnetic resistance sensor of claim 7 wherein said one of the pair of ferromagnetic layers located adjacent to the antiferromagnetic layer comprises a pair of ferromagnetic films that are antiferromagnetically coupled with a non-magnetic film sandwiched in between, wherein one of the pair of ferromagnetic films is located adjacent to the antiferromagnetic layer is exchange-coupled with the antiferromagnetic layer in a presence of an applied magnetic field.

10. The spin-valve magnetic resistance sensor of claim 9 wherein the pair of ferromagnetic films of the first ferromagnetic layer comprise one of a metal or an alloy of two or more metals selected from a set comprising Co, Fe and Ni, wherein the non-magnetic film of said one of the pair of ferromagnetic layers comprise one of a metal or an alloy of two or more metals selected from a set comprising Ru, Cr, Rh and Ir.

11. The spin-valve magnetic resonance sensor of claim 1 included in a thin-film magnetic head.

* * * * *